(12) United States Patent
Nishizawa et al.

(10) Patent No.: US 8,528,725 B2
(45) Date of Patent: Sep. 10, 2013

(54) FLEXIBLE SUBSTRATE CONVEYING DEVICE

(75) Inventors: Masanori Nishizawa, San Jose, CA (US); Shoji Yokoyama, Hachioji (JP); Takanori Yamada, Hachioji (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/512,231

(22) PCT Filed: Dec. 2, 2010

(86) PCT No.: PCT/JP2010/071551
§ 371 (c)(1),
(2), (4) Date: Aug. 2, 2012

(87) PCT Pub. No.: WO2011/070960
PCT Pub. Date: Jun. 16, 2011

(65) Prior Publication Data
US 2012/0298298 A1    Nov. 29, 2012

(30) Foreign Application Priority Data
Dec. 11, 2009  (JP) .................................. 2009-281989

(51) Int. Cl.
*B65G 15/12*  (2006.01)
(52) U.S. Cl.
USPC ...................... 198/626.6; 198/626.4; 198/606
(58) Field of Classification Search
USPC ........... 198/604, 605, 606, 620, 626.1, 626.2, 198/626.3, 626.4, 626.5, 626.6
See application file for complete search history.

(56) References Cited

U.S. PATENT DOCUMENTS

| | | | | |
|---|---|---|---|---|
| 3,290,041 A * | 12/1966 | Cunningham | ................ | 198/606 |
| 3,468,409 A * | 9/1969 | Ball | ........................... | 198/626.6 |
| 3,638,279 A * | 2/1972 | Swados | ........................ | 198/606 |
| 3,638,409 A * | 2/1972 | Kuska | ............................ | 56/339 |
| 5,044,269 A * | 9/1991 | Bielfeldt | .................... | 198/626.6 |
| 5,094,378 A * | 3/1992 | Aso et al. | ................... | 198/626.4 |
| 5,121,684 A * | 6/1992 | Bielfeldt | .................... | 198/626.6 |
| 5,490,666 A * | 2/1996 | Albert | ........................ | 198/626.4 |
| 6,427,827 B1 * | 8/2002 | Berndtsson | ................ | 198/626.6 |
| 7,611,141 B2 * | 11/2009 | Williams et al. | ........... | 198/626.4 |
| 2009/0047114 A1 | 2/2009 | Yokoyama | | |
| 2011/0086457 A1 | 4/2011 | Yokoyama | | |

FOREIGN PATENT DOCUMENTS

| | | |
|---|---|---|
| JP | 2000-263660 A | 9/2000 |
| JP | 2005-072408 A | 3/2005 |

* cited by examiner

*Primary Examiner* — James R Bidwell
(74) *Attorney, Agent, or Firm* — Manabu Kanesaka

(57) ABSTRACT

A conveying device has a substrate conveying device for conveying a flexible substrate while holding the flexible substrate upright, with one end part in a width direction of the flexible substrate being on an upper side; and a substrate retaining device. The substrate retaining device has a pair of grip rollers; a support mechanism rotatably supporting the pair of grip rollers; a transmission mechanism transmitting a force to pressure contact one of the grip rollers with the other grip roller; a first driving device configured to adjust a pressure contact force of the pair of grip rollers; an angle adjusting mechanism configured to incline the pair of grip rollers with respect to a conveying direction of the flexible substrate; and a second driving device configured to adjust an inclination angle of the pair of grip rollers with respect to the conveying direction of the flexible substrate.

9 Claims, 14 Drawing Sheets

FLEXIBLE SUBSTRATE CONVEYING DEVICE

RELATED APPLICATIONS

The present application is National Phase of International Application No. PCT/JP2010/71551 filed Dec. 2, 2010, and claims priority from Japanese Application No. JP PA 2009-281989 filed Dec. 11, 2009, the disclosure of which is hereby incorporated by reference herein in its entirety.

TECHNICAL FIELD

The present invention relates to a conveying device for conveying a belt-like flexible substrate. More specifically, the present invention relates to a conveying device that is used in a device for manufacturing a thin-film laminated body such as a thin-film photoelectric conversion element by forming a plurality of thin films on a flexible substrate.

BACKGROUND ART

Normally, a rigid substrate is used as a substrate to make a thin-film laminated body such as a semiconductor thin film. However, a flexible substrate such as a plastic film is often used for the purpose of cost reduction and improving the productivity in which the substrate is handled using a roll.

For example, Patent Document 1 discloses a device that uses a plurality of film-forming chambers to stack a plurality of thin films of different qualities on each of belt-like flexible substrates that are supplied from an unwinding roll, while conveying the flexible substrates at a predetermined pitch.

As this type of flexible substrate conveying device, there is a type that transports a flexible substrate with a width direction thereof matched with a horizontal direction, and a type that transports a flexible substrate while having the flexible substrate upright with one end part thereof up in a width direction of the substrate. The latter has a smaller installation area than the former and is more advantageous than the former in that a surface of the flexible substrate is not contaminated easily.

However, the longer the span for conveying the flexible substrate, the more complicated it is no maintain a constant conveyance height of the flexible substrate against the gravity, weighing down the flexible substrate or frequently generating wrinkles on the surface of the flexible substrate.

For this reason, there has been conventionally proposed a substrate retaining device for maintaining a conveyance height of a flexible substrate.

FIG. 14 shows an example of a substrate retaining device of a conventional flexible substrate conveying device.

As shown in FIG. 14, a conventional substrate retaining device 90 has a pair of grip rollers 91, 92 for sandwiching an end part on the upper side of a flexible substrate 93, and a roller fixing part 94 for fixing the pair of grip rollers 91, 92.

Surfaces of the pair of grip rollers 91, 92 are covered with elastic bodies 91a, 92a, respectively. A pair of roller fixing shafts 95, 96 is attached to the roller fixing part 94. The pair of grip rollers 91, 92 is attached rotatably to lower parts 95a, 96a of the roller fixing shafts 95, 96. On the other hand, an upper end 95b of the roller fixing shaft 95 is fixed to the roller fixing part 94, and an upper end 96b of the other roller fixing shaft 96 is attached rotatably to the roller fixing part 94 via a hinge 97. In this manner, the pair of grip rollers 91, 92 is configured to contact with and separate from each other by causing the roller fixing shaft 96 to turn around the hinge 97.

Upper surfaces of both of the roller fixing shafts 95, 96 are provided with spring attachment parts 95c, 96c. The spring attachment parts 95c, 96c are coupled to each other by a tension spring 98. This tension spring 98 generates an urging force in a pressure contact direction of the pair of grip rollers 91, 92. One end of the tension spring 98 is attached to the spring attachment part 95c via an urging force adjusting screw 99. The substrate retaining device 90 can adjust a pressure generated between the pair of grip rollers 91, 92, by rotating the urging force adjusting screw 99.

Patent Document 1: Japanese Patent Application Publication No. 2005-72408

However, in the conventional substrate retaining device 90 described above, frictional forces of the elastic bodies 91a, 92a on the surface of the grip rollers 91, 92 become weak over time, which might result in a decrease of gripping forces of the grip rollers 91, 92. In this case, the flexible substrate 93 can be loose and weighed down from the pair of grip rollers 91, 92.

Moreover, in the conventional substrate retaining device 90 described above, constantly applying a large pressure between the grip rollers 91, 92 can change the diameter the grip rollers 91, 92, In this case, a lifting force applied to the flexible substrate 93 drops, and a conveyance height of the flexible substrate 93 cannot be kept constant.

DISCLOSURE OF THE INVENTION

The present invention was devised in view of the circumstances described above, and an object thereof is to provide a flexible substrate conveying device that is capable of keeping a constant conveyance height of a flexible substrate without being affected by a decrease in a frictional force of a grip roller or a change in diameter of the grip roller.

In order to solve the problems of the conventional technology described above, the present invention provides a conveying device for conveying a belt-like flexible substrate. The conveying device has a substrate conveying device for conveying the flexible substrate while having the flexible substrate upright, with one end part thereof being on an upper side in a width direction of the flexible substrate; and a substrate retaining device for maintaining a conveyance height of the flexible substrate. The substrate retaining device has a pair of grip rollers that sandwiches at least an upper-side end part of the flexible substrate; a support mechanism that supports the pair of grip rollers so that the pair of grip rollers can rotate and contact with and separate from each other; a transmission mechanism that is coupled to the support mechanism and transmits a force to pressure contact one of the grip rollers with the other grip roller; a first driving device coupled to the transmission mechanism and configured to adjust the pressure contact force of the pair of grip rollers by performing an angular displacement on a coupled section where the first driving device is coupled to the transmission mechanism; an angle adjusting mechanism that is coupled to the support mechanism and configured to incline the pair of grip rollers with respect to a conveying direction of the flexible substrate by rotating around a spindle used as a supporting point of the angle adjusting mechanism; and a second driving device coupled to the angle adjusting mechanism and configured to adjust an inclination angle of the pair of grip rollers with respect to the conveying direction of the flexible substrate by performing the angular displacement on a coupled section where the second driving device is coupled to the angle adjusting mechanism.

According to another aspect of the present invention, the substrate retaining device has a pair of lower grip rollers that sandwiches a lower-side end part of the flexible substrate therebetween; a lower support mechanism that supports the pair of lower grip rollers so that the pair of lower grip rollers can rotate and contact with and separate from each other; a lower transmission mechanism that is coupled to the lower support mechanism and transmits a force to pressure contact one of the lower grip rollers with the other lower grip roller; a first lower driving device coupled to the lower transmission mechanism and configured to adjust the pressure contact force of the pair of lower grip rollers by performing an angular displacement on a coupled section where the first lower driving device to the lower transmission mechanism; a lower angle adjusting mechanism that is coupled to the lower support mechanism and configured to incline the pair of lower grip rollers with respect to a conveying direction of the flexible substrate by rotating around a spindle used as a supporting point of the lower angle adjusting mechanism; and a second lower driving device that is coupled to the lower angle adjusting mechanism and configured to adjust an inclination angle of the pair of lower grip rollers with respect to the conveying direction of the flexible substrate by performing an angular displacement on a coupled section where the second lower driving device is coupled to the lower angle adjusting mechanism.

According to yet another aspect of the present invention, a plurality of film-forming chambers for stacking a plurality of thin films on a surface of the flexible substrate to form a thin-film laminated body are disposed along the conveying direction of the flexible substrate, and at least one substrate retaining device is disposed between the plurality of film-forming chambers.

According to yet another aspect of the present invention, the transmission mechanism and the first driving device are disposed in one of adjacent film-forming chambers, the angle adjusting mechanism and the second driving device are disposed in the other one of the adjacent film-forming chambers, and the pair of grip rollers and the support mechanism are disposed in a boundary section between the adjacent film-forming chambers.

The conveying device for conveying a belt-like flexible substrate, according to the present invention, has a substrate conveying device for conveying the flexible substrate while having the flexible substrate upright, with one end part thereof being on an upper side in a width direction of the substrate; and a substrate retaining device for maintaining a conveyance height of the flexible substrate. The substrate retaining device has a pair of grip rollers that sandwiches at least an upper-side end part of the flexible substrate; a support mechanism that supports the pair of grip rollers so that the pair of grip rollers can rotate and contact with and separate from each other; a transmission mechanism that is coupled to the support mechanism and transmits a force to pressure contact one of the grip rollers with the other grip roller; a first driving device coupled to the transmission mechanism and configured to adjust the pressure contact force of the pair of grip rollers by performing an angular displacement on a coupled section where the first driving device is coupled to the transmission mechanism; an angle adjusting mechanism that is coupled to the support mechanism and configured to incline the pair of grip rollers with respect to a conveying direction of the flexible substrate by rotating around a spindle used as a supporting point of the angle adjusting mechanism; and a second driving device coupled to the angle adjusting mechanism and configured to adjust an inclination angle of the pair of grip rollers with respect to the conveying direction of the flexible substrate by performing an angular displacement on a coupled section where the second driving device is coupled to the angle adjusting mechanism. Thus, even when a lifting force of the grip rollers drops due to a decrease in frictional forces of the grip rollers or a change in diameter of the grip rollers, the lifting force can be increased by allowing the angle adjusting mechanism to adjust the angle of the pair of grip rollers. As a result, the conveyance height of the flexible substrate can be kept constant, preventing the flexible substrate from being weighed down.

In addition, according to the conveying device of the present invention, the flexible substrate can be conveyed by adjusting not only the pressure between the pair of grip rollers but also the angle of the pair of grip rollers. Therefore, the conveyance height of the flexible substrate can be controlled with a high degree of accuracy.

In the conveying device for conveying a belt-like flexible substrate, according to the present invention, the substrate retaining device has a pair of lower grip rollers that sandwiches a lower-side end part of the flexible substrate; a lower support mechanism that rotatably supports the pair of lower grip rollers to contact with and separate from each other; a lower transmission mechanism that is coupled to the lower support mechanism and transmits a force to pressure contact one of the lower grip rollers with the other lower grip roller; a first lower driving device coupled to the lower transmission mechanism and configured to adjust the pressure contact force of the pair of lower grip rollers performing an angular displacement on a coupled section where the first lower driving device is coupled to the lower transmission mechanism; a lower angle adjusting mechanism that is coupled to the lower support mechanism and configured to incline the pair of lower grip rollers with respect to a conveying direction of the flexible substrate by rotating around a spindle used as a supporting point of the lower angle adjusting mechanism; and a second lower driving device coupled to the lower angle adjusting mechanism and configured to adjust an inclination angle of the pair of lower grip rollers with respect to the conveying direction of the flexible substrate by performing an angular displacement on a coupled section where the second lower driving device is coupled to the lower angle adjusting mechanism. Thus, the lifting force of the pair of grip rollers and a pulling force of the pair of lower grip rollers can stretch the flexible substrate in the width direction, preventing, more effectively, the generation of wrinkles in the flexible substrate.

Moreover, in the conveying device for conveying a belt-like flexible substrate, according to the present invention, a plurality of film-forming chambers for stacking a plurality of thin films on a surface of the flexible substrate to form a thin-film laminated body disposed along the conveying direction of the flexible substrate, and at least one substrate retaining device is disposed between the plurality of film-forming chambers. Thus, the conveyance height of the flexible substrate can be kept constant in a device for manufacturing a thin-film laminated body where a plurality of thin films of different qualities are stacked on the flexible substrate. In this manner, the flexible substrate can be prevented from being weighed down.

In the conveying device for conveying a belt-like flexible substrate, according to the present invention, the transmission mechanism and the first driving device are disposed in one of adjacent film-forming chambers, the angle adjusting mechanism and the second driving device are disposed in the other one of the adjacent film-forming chambers, and the pair of grip rollers and the support mechanism are disposed in a boundary section between the adjacent film-forming chambers. Thus, the substrate retaining device can be installed in a small space between the adjacent film-forming chambers, conserving installation space in the film-forming chambers.

BEST MODE FOR CARRYING OUT THE INVENTION

Figure 1:
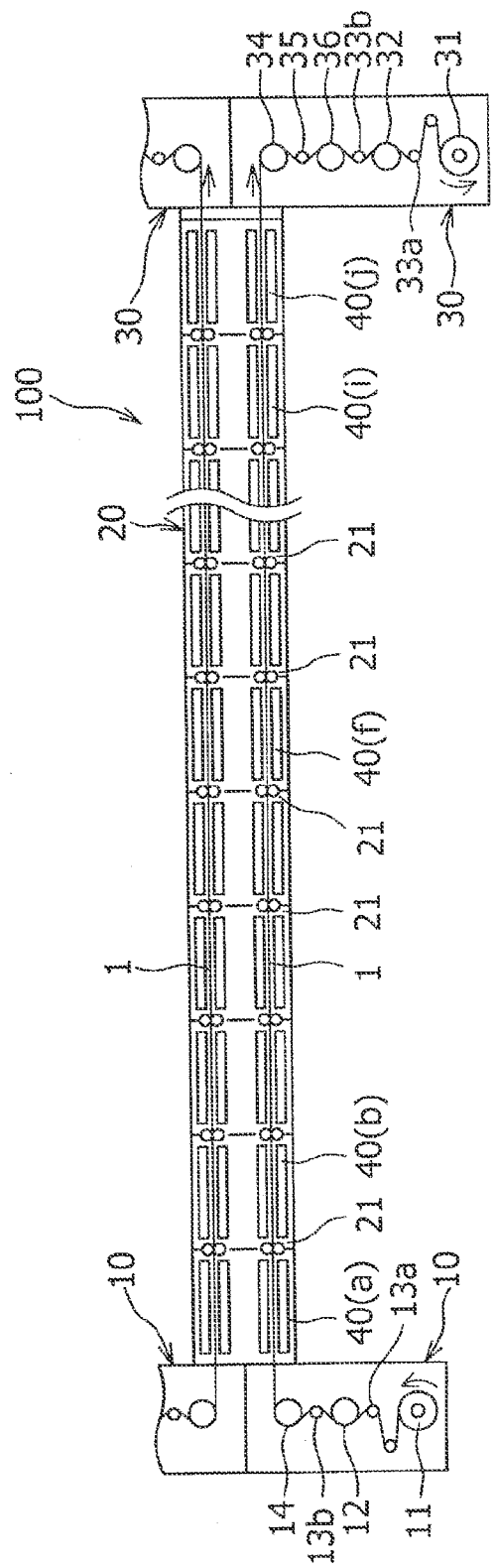
FIG. 1 is a schematic plan view showing the entire configuration of a conveying device according to an embodiment of the present invention.

A conveying device for conveying a flexible substrate according to an embodiment of the present invention is described hereinafter with reference to the drawings. FIG. 1 is a schematic plan view showing the entire configuration of a conveying device 100 according to the embodiment of the present invention.

As shown in FIG. 1, the conveying device 100 for conveying a flexible device, according to the present embodiment, has an unwinding part 10 for feeding a belt-like flexible substrate 1, and a winding part 30 for winding the flexible substrate 1 on which a thin-film laminated body is formed. Note that the flexible substrate 1 is placed upright with one end part thereof up in a width direction of the flexible substrate, and conveyed. The present embodiment describes a situation where the flexible substrate 1 is conveyed such that the width direction thereof is a vertical direction, but the present invention is not limited thereto.

For instance, the conveying device 100 according to the present embodiment is used in a device that manufactures a thin-film laminated body, such as a thin-film photoelectric conversion element, by forming a plurality of thin films on the flexible substrate 1. As shown in FIG. 1, the conveying device 100 further has a film-forming part 20 between the unwinding part 10 and the winding part 30 to stack a plurality of thin films on the flexible substrate 1. Here, the unwinding part 10, the film-forming part 20 and the winding part 30 are couple to one another hermetically to keep a predetermined degree of vacuum in the entire conveying device 100. Furthermore, the conveying device 100 has two types of manufacturing lines laid out parallel. The unwinding part 10 and the winding part 30 are placed in each of the manufacturing lines, but the film-forming part 20 is configured such that the two types of manufacturing lines share a common chamber structure.

As shown in FIG. 1, the unwinding part 10 has an unwinding roll 11 for feeding the flexible substrate 1, an unwinding feed roller 12 for feeding the flexible substrate 1, which is fed from the unwinding roll 11, toward the film-forming part 20, unwinding tension detection rollers 13$a$, 13$b$ for detecting a tension of the flexible substrate 1 fed from the unwinding roll 11, and unwinding guide roller 14 for guiding the flexible substrate 1 to the film-forming part 20 in an upstream of the film-forming part 20.

The unwinding roll 11, the unwinding feed roller 12, the unwinding tension detection rollers 13$a$, 13$b$, and the unwinding guide roller 14 are installed such that axial directions thereof correspond to the width direction of the flexible substrate 1. Note that each roller described hereinafter is also installed such that an axial direction thereof corresponds to the width direction of the flexible substrate 1 (the width direction of the flexible substrate 1 is the vertical direction in the present embodiment), unless otherwise state.

As shown in FIG. 1, the winding part 30 is configured by a winding roll 31 for winding the flexible substrate 1, a winding feed roller 32 for feeding the flexible substrate 1 toward the winding roll 31, winding tension detection rollers 33$a$, 33$b$ for detecting a tension of the flexible substrate 1 fed from the film-forming part 20, a winding guide roller 34 for guiding the flexible substrate 1 in a downstream of the film-forming part 20, a side end position controlling (EPC) roller 35 for controlling the position of the flexible substrate 1 in the width direction in the winding guide roller 34, and an idling roller 36.

Note that the side end position controlling roller 35 is configured to be able to tilt an axial direction thereof with respect to the vertical direction and fine-adjust a feed direction of the flexible substrate 1 upward or downward by tilting a rotation axis (not shown) of the side end position controlling roller 35 based on a detection value of the conveyance height of the flexible substrate 1 in the winding guide roller 34.

As shown in FIG. 1, the film-forming part 20 has a plurality of film-forming chambers 40 ($a$, . . . , $j$) for stacking thin films on the flexible substrate 1 conveyed from the unwinding part 10 to the winding part 30. The plurality of film-forming chambers 40 ($a$, . . . , $j$) is arranged at a predetermined pitch along a linear path of the flexible substrate 1 between the unwinding part 10 and the winding part 30. Moreover, each of the film-forming chambers 40 is configured by a vacuum deposition unit for CVD (Chemical Vapor Deposition) such as plasma CVD or PVD (Physical Vapor Deposition) such as spattering.

For example, when the conveying device 100 is a device for manufacturing a thin-film solar cell by stacking photoelectric conversion elements on the flexible substrate 1, the conveying device 100 is then configured by a plurality of film-forming chambers 40 (a, b, ...) for stacking the photoelectric conversion elements of pin structure by performing plasma CVD, and two film-forming chambers 40 (i, j) for stacking electrode layers on surfaces of the photoelectric conversion elements and the back of the flexible substrate 1 by device of spattering.

Figure 2:
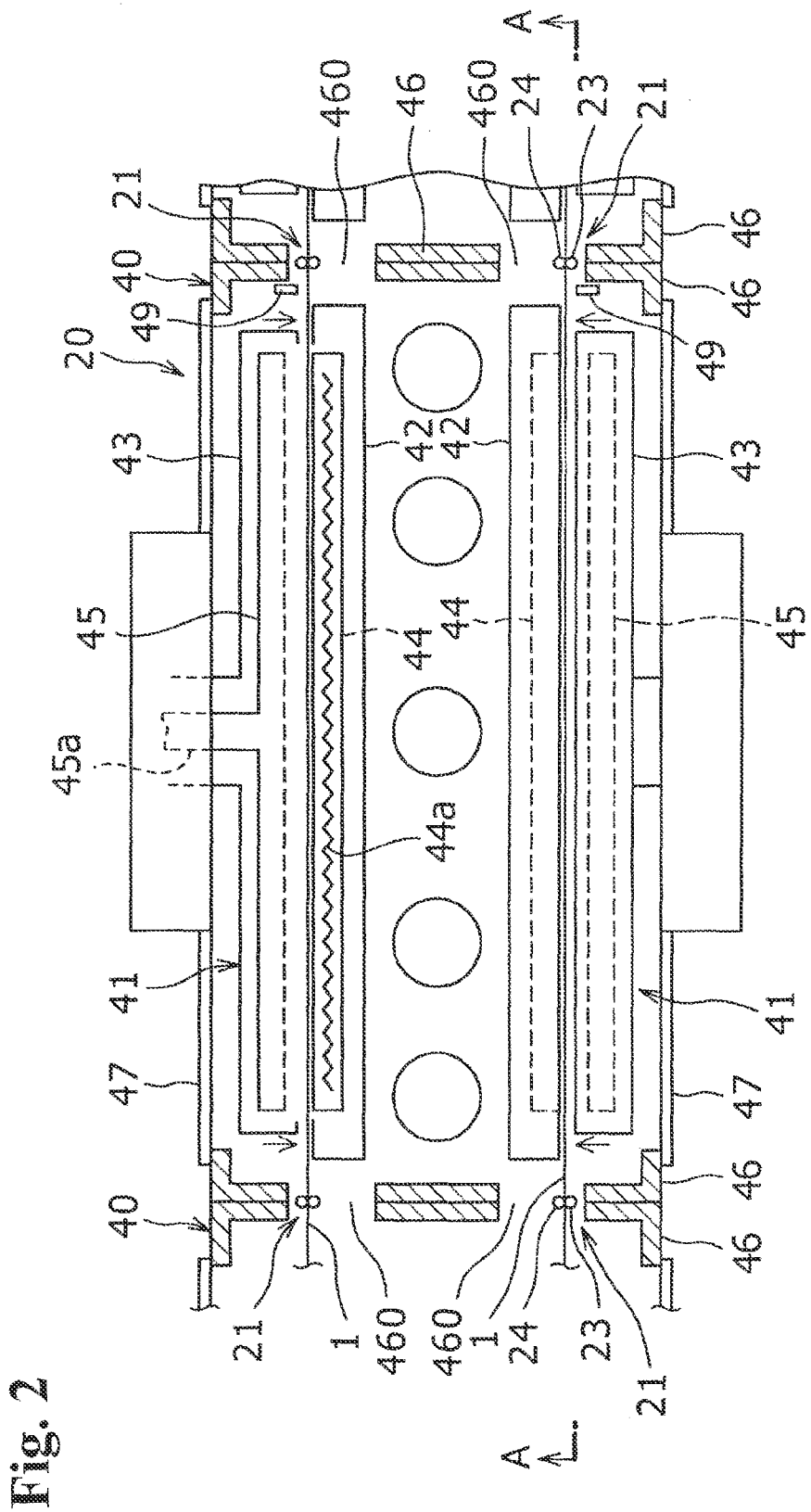
FIG. 2 is a schematic plan view showing one film-forming chamber disposed along the conveying device according to the embodiment of the present invention.
Figure 3:
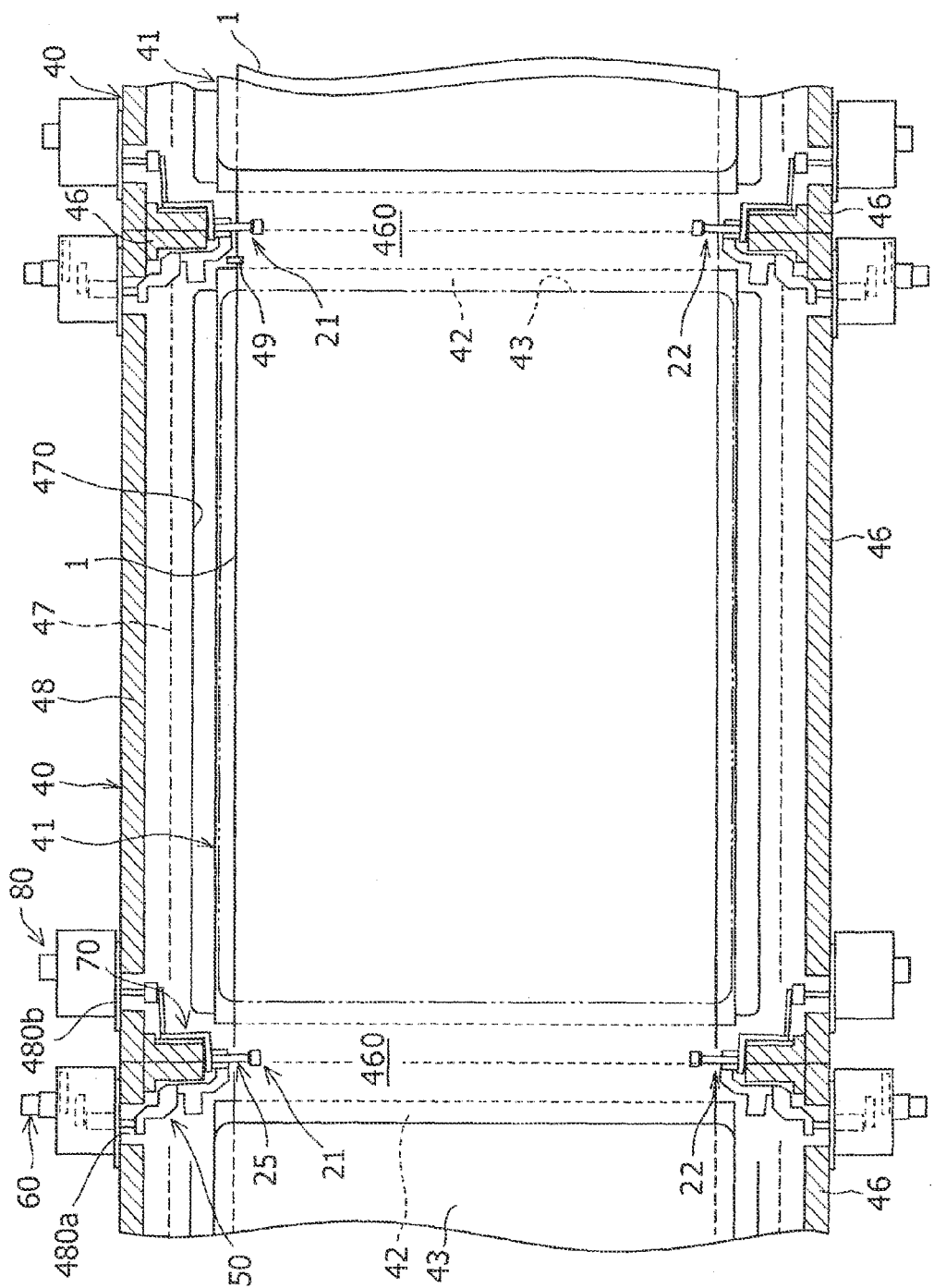
FIG. 3 is a cross-sectional diagram taken along a line A-A shown in FIG. 2.

FIG. 2 schematically shows one of the film-forming chambers 40 performing plasma CVD. FIG. 3 is a cross-sectional diagram taken along a line A-A shown in FIG. 2.

As shown in FIG. 2, the film-forming chamber 40 has two film-forming units 41 corresponding to the two manufacturing lines. Each film-forming unit 41 has a fixed chamber 42, and a movable chamber 43 that contacts with and separated from the fixed chamber 42 by forward/backward driving device (not shown) such as a fluid pressure cylinder.

As shown in FIG. 2, a ground electrode 44 containing a heater 44a is placed in the fixed chamber 42. On the other hand, a high-frequency electrode 45 having a number of gas ejection holes (not shown) formed on a surface thereof is placed in the movable chamber 43. Note that this high-frequency electrode 45 is connected to a high-frequency power source (not shown) outside the film-forming chamber 40.

As shown in FIGS. 2 and 3, the film-forming chamber 40 further has a main structural material 46 placed in a circumferential part thereof, side walls 47 provided in the main structural material 46, in a manner as to be opened and closed, and a ceiling panel 48 fixed in an upper part of the main structural material 46. The movable chamber 43 including the high-frequency electrode 45 is attached to each of the side walls 47. A boundary section between the film-forming chambers 40 is provided with an opening 460 for allowing the passage of the flexible substrate 1, the opening 460 formed an a manner as to penetrate through the main structural material 46.

To form a thin film in the film-forming chamber 40, first, during a stop time period of an intermittent conveyance cycle of the flexible substrate 1, the movable chamber 43 and the fixed chamber 42 pressed to contact with each other (in a direction of an arrow shown in FIG. 2) to sandwich the flexible substrate 1 between the movable chamber 43 and the fixed chamber 42. Next, raw material gas containing a thin-film component is introduced into the film-forming chamber 40 via a gas introduction pipe 15a, and a voltage is applied to the high-frequency electrode 45, to generate plasma. Consequently, a thin film is formed on the surface of the flexible substrate 1 by a chemical reaction of the raw material gas.

Furthermore, the conveying device 100 according to the present embodiment has substrate retaining devices 21, 22 for maintaining a conveyance height of the flexible substrate 1 in the plurality of film-forming chambers 40, as shown in FIGS. 2 and 3. The substrate retaining devices 21, 22 are disposed in the boundary sections between the film-forming chambers 40.

The substrate retaining devices 21, 22 are installed one above the other between the film-forming chambers 40 to retain both ends of the flexible substrate 1 in the width direction thereof (the vertical direction) (see FIG. 3). Note that the following describes the substrate retaining device 21 disposed on the upper side, and the description or the substrate retaining device 22 disposed on the lower side is omitted as it has the same configurations as the substrate retaining device 21.

As shown in FIGS. 2 and 3, the substrate retaining device 21 has a pair of grip rollers 23, 24 for sandwiching a vertical direction upper-side end part of the flexible substrate 1, a detection sensor 49 for detecting the conveyance height of the flexible substrate 1 in an upstream of the conveying direction of the flexible substrate 1, support mechanism 25 that rotatably supports the pair of grip rollers 23, 24 to contact with and separate from each other, a transmission mechanism 50 that transmits a force to pressure contact the grip roller 23 with the grip roller 24, and a pressure adjustment driving device (the first driving device) 60 that is configured to adjust the pressure contact force of the pair of grip rollers 23, 24 based on a detection value of the detection sensor 49.

Figure 4:
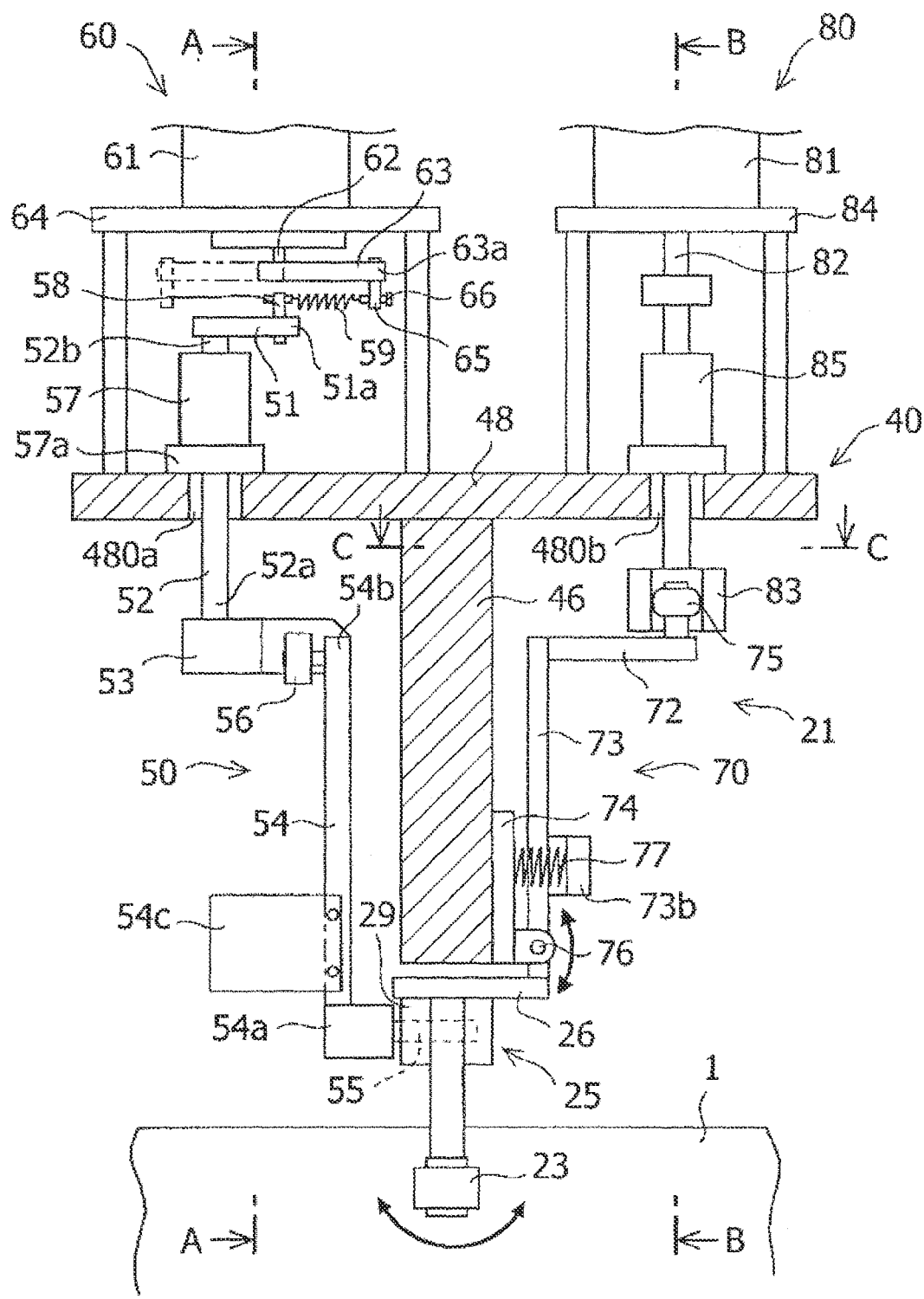
FIG. 4 is an enlarged cross-sectional diagram of a substrate retaining device of the conveying device according to the embodiment of the present invention.
Figure 5:
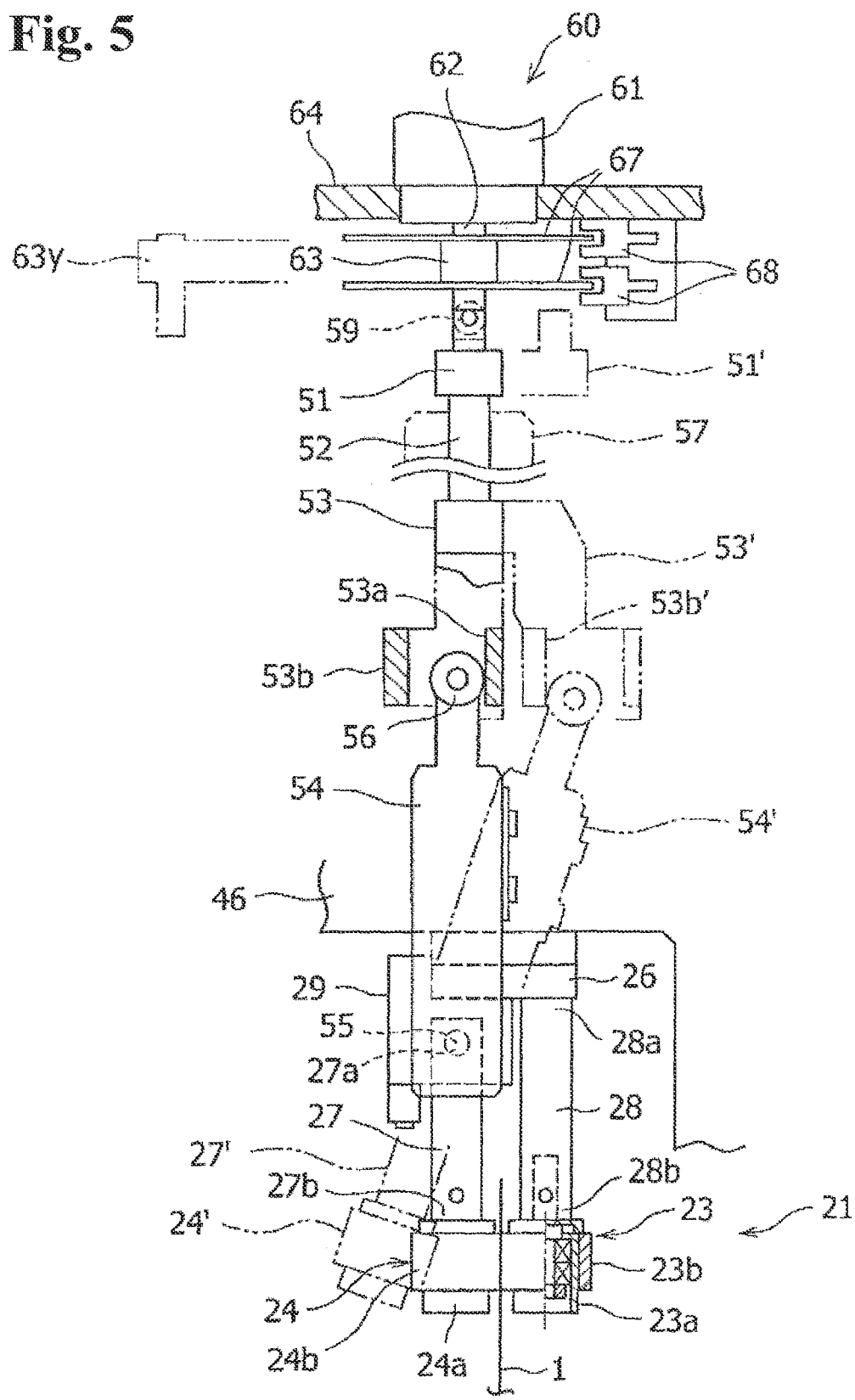
FIG. 5 is a cross-sectional diagram taken along a line A-A shown in FIG. 4.

FIG. 4 is an enlarged cross-sectional diagram of the substrate retaining device 21 of FIG. 3. FIG. 5 is a cross-sectional diagram taken along a line A-A shown in FIG. 4.

As shown in FIGS. 4 and 5, the pair of grip rollers 23, 24 is configured from a fixed roller 23 and a movable roller 24. The fixed roller 23 has a metallic roller main body 23a and a heat-resistant rubber coating 23b applied to a circumferential surface of the roller main body 23a. The movable roller 24 similarly has a metallic roller main body 24a and a heat-resistant rubber coating 24b applied to a circumferential surface of the roller main body 24a.

As shown in FIGS. 4 and 5, the support mechanism 25 is configured from a plate-like bracket 26, and a movable roller supporting member 27 and a fixed roller supporting member 28, which are attached to a lower surface of the bracket 26. An upper end 27a of the movable roller supporting member 27 is provided with a coupling part 29 to which the transmission mechanism 50 is coupled. The roller main body 24a of the movable roller 24 is attached rotatably to a lower end 27b of the movable roller supporting member 27 by using a bearing (not shown). Furthermore, the roller main body 23a of the fixed roller 23 is attached rotatably to a lower end 28b of the fixed roller supporting member 28 by using a bearing.

As shown in FIGS. 4 and 5, the transmission mechanism 50 is configured from a first arm 51 coupled to the pressure adjustment driving device 60, a turning shaft 52 extending downward from the first arm 51, a second arm 53 attached to the turning shaft 52, and an extending arm 54 connecting the second arm 53 and the coupling part 29 of the support mechanism 25 to each other.

As shown in FIGS. 4 and 5, the extending arm 54 is formed in a manner as to bypass the main structural material 46 of the film-forming chamber 40 from the second arm 53 to extend toward the coupling part 29 of the support mechanism 25. A Lower end part 54a of the extending arm 54 is provided with a shaft 55. This shaft 55 is attached turnably to the coupling part 29 of the support mechanism 25 by using a bearing (not shown).

In addition, the shaft 55 of the extending arm 54 is fixed to the upper end part 27a of the movable roller supporting member 27 by using a locking screw (not shown). In this manner, the movable roller supporting member 27 can integrally turn around the shaft 55 along with the extending arm 54, and the movable roller 24 and the fixed roller 23 can contact with and separate from each other. Furthermore, a roller 56 that has the conveying direction of the flexible substrate 1 as an axial core is attached turnably to an upper end part 54b of the extending arm 54. An operating plate 54c for releasing the pair of grip rollers 23, 24 is attached to an intermediate part of the extending arm 54, as described hereinafter.

As shown in FIGS. 4 and 5, the second arm 53 is attached to a lower end part 52a of the turning shaft 52 positioned inside the film-forming chamber 40. The second arm 53 has first and second engaging parts 53a, 53b that engages with the extending arm 54. The roller 56 of the extending arm 54 is disposed between the first engaging part 53a and the second engaging part 53b. The first engaging part 53a and the second engaging part 53b are disposed in a manner as to face each other with a space, larger than a diameter of the roller 54, therebetween.

As shown in FIG. 4, the turning shaft 52 is pierced through the ceiling panel 48 of the film-forming chamber 40, extends in the vertical direction, and is then attached to the ceiling panel 48 of the film-forming chamber 40 via a sealed bearing 57. The first arm 51 is fixed to an upper end part 52b of the turning shaft 52 positioned outside the film-forming chamber 40. The sealed bearing 57 is attached to an opening part 480a of the film-forming chamber 40 via a plate 57a or an O-ring, to support the turning shaft 52 hermetically and turnably. Note that a transparent member, such as a heat-resistant glass, is mounted in another opening part where the sealed bearing 57 and the turning shaft 52 are not installed, forming an observation door for observing the inside of the film-forming chamber 40.

As shown in FIG. 4, a coupling pin 58 is provided in an upward protruding manner on a tip end part 51a of the first arm 51. The coupling pin 53 is supported turnably by a supporting hole (not shown) that is pierced vertically through the tip end part 51a of the first arm 51. Also, one end of a spring 59 is coupled to the coupling pin 58. This spring 59 is a tension spring, the other end of which is coupled to the pressure adjustment driving device 60.

As shown in FIG. 4, the pressure adjustment driving device 60 is configured from an actuator 61, a driving shaft 62 extending from the actuator 61, and a driving arm 63 fixed to the driving shaft 62.

The actuator 61 is a rotary actuator, such as a servomotor. The actuator 61 is disposed on an upper plate 64 that is fixed by a supporting frame (not shown). The driving shaft 62 of actuator 61 is provided in a position where the driving shaft 62 can face the coupling pin 58 of the first arm 51 and can be coaxial with the coupling pin 58.

As shown in FIG. 4, a support pin 65 is provided in a downward protruding manner on a tip end part 63a of the driving arm 63. The support pin 65 is supported turnably by a supporting hole (not shown) that is pierced vertically through the tip end part 63a of the driving arm 63. Furthermore, the other end of the spring 59 is coupled to the support pin 65 of the driving arm 63 via an adjustable spring 66.

The spring 59 is stretched beforehand and attached between the coupling pin 58 of the first arm 51 and the support pin 65 of the driving arm 63. A tension F of the spring 59 can be adjusted by adjusting its elongation degree by using the adjustable screw 66. Furthermore, as shown in FIG. 5, a sector plate 67 is attached coaxially to a base end part of the driving arm 63. An over-travel sensor 6.8 is disposed proximal to on an outer circumference of the sector plate 67.

Figure 6:
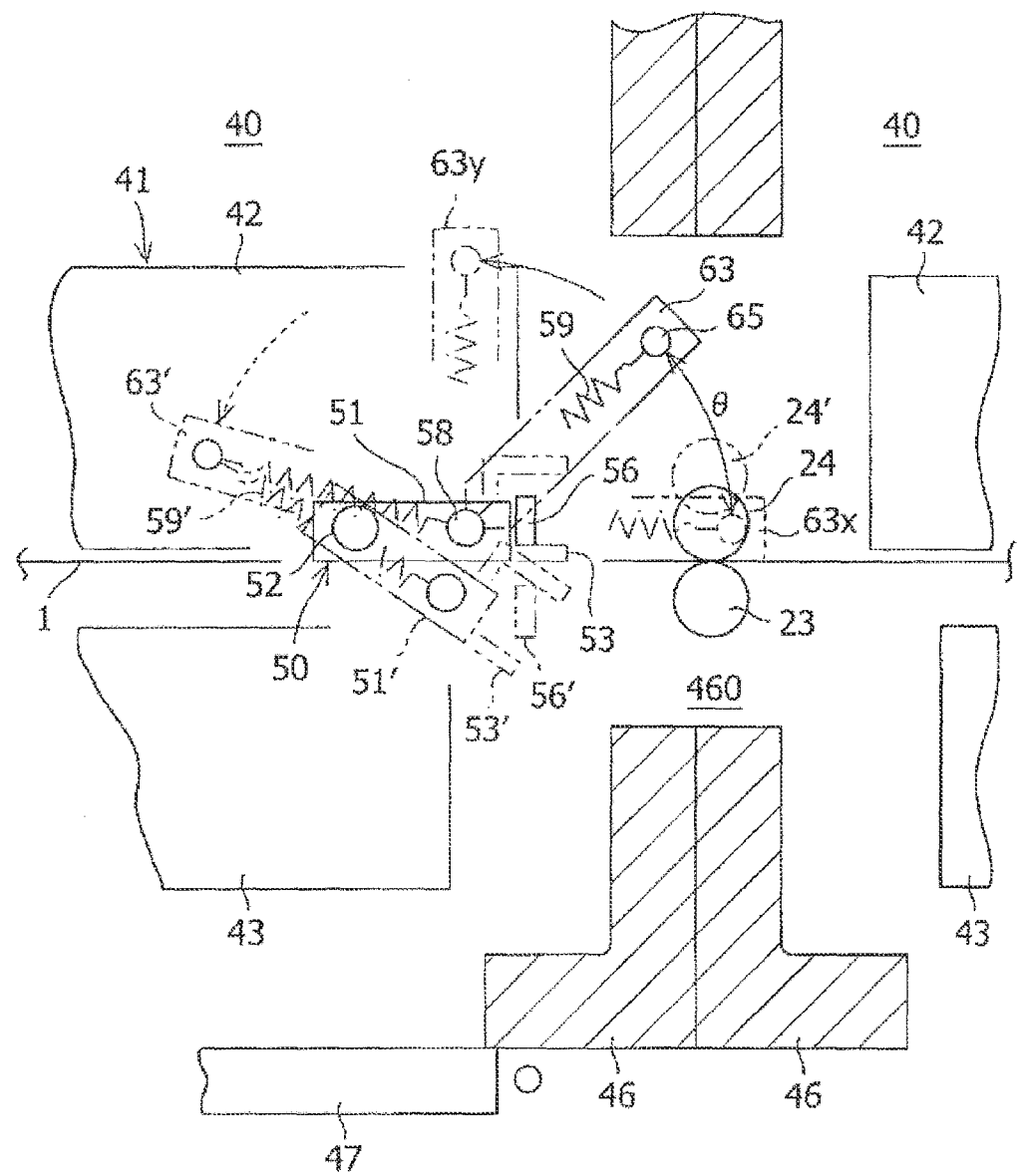
FIG. 6 is a view showing the substrate retaining device of FIG. 4 from above.

Next, a procedure is described for adjusting the pressure of the pair of grip rollers 23, 24 by using the actuator 61 of the pressure adjustment driving device 60. FIG. 6 is a diagram showing the substrate retaining device 21 of the present embodiment from above.

The actuator 61 is driven by a control signal that is output based on the detection value of the detection sensor (see FIG. 3) 49. As shown in FIG. 6, the actuator 61 turns and displaces the driving arm 63 to a predetermined angular position between a minimum pressurizing position 63x and a maximum pressurizing position 63y. As a result, an urging force corresponding to the angular displacement of the driving arm 63 is imposed upon the first arm 51 of the transmission mechanism 50.

As shown in FIG. 6, when the driving arm 63 is located in the minimum pressurizing position 63x where no angular displacement is performed, an orthogonal component. (Fy=F·sin θ) that turns the first arm 51 in a counterclockwise direction in FIG. 6 is zero. Therefore, no urging force acts to turn the first arm 51 around the turning shaft 52 in the counterclockwise in FIG. 6.

In this state, when the driving arm 63 is turned up to an angular displacement θ, the orthogonal component (Fy=F·sin θ) of the tension of the spring 59 acts as an urging force for turning the first arm 51 the counterclockwise direction in FIG. 6.

This urging force is transmitted to the second arm 53 via the turning shaft 52. Then, as shown in FIG. 5, in a state in which the first engaging part 53a of the second arm 53 and the roller 56 of the extending arm 54 are in abutment with each other, the roller 56 of the extending arm 54 is pushed by the first engaging part 53a, in an opposite direction of the flexible substrate 1. As a result, the extending arm 54 and the movable supporting member 27 turn around the shaft 55, and the movable roller 24 pressure contacts with the fixed roller 23 by a pressure obtained by multiplying the urging force by a lever ratio.

As shown in FIG. 6, when the driving arm 63 is turned to the maximum pressurizing position 63y perpendicular to the first arm 51, the whole of the tension F of the spring 59 acts as an urging force for turning the first arm 51 around the turning shaft 52, in the counterclockwise direction in FIG. 6. As a result, the movable roller 24 pressure contacts with the fixed roller 23 by a pressure obtained by multiplying the biasing force by the lever ratio.

Next is described a procedure for releasing the pair of grip rollers 23, 24 with reference to FIGS. 4 to 6.

When introducing the flexible substrate 1, unprocessed, from the unwinding roll 11 into the film-forming chamber 40, the pressure-contact state of the pair of grip rollers 23, 24 needs to be released. In so doing, first, a release switch or the like, not shown, is operated to send a release signal to the actuator 6. Once the release signal is sent, the driving arm 63 is angular-displaced up to a position 63' past the maximum pressurizing position 63y, as shown by a double-dashed line in FIG. 6.

Thereafter, an operator moves the operating plate 54c of the extending arm 54 toward the flexible substrate 1. In so doing, the extending arm 54 moves to a point 54' shown in FIG. 5, while the second engaging part 53b of the second arm 53 and the roller 56 of the extending arm 54 are in abutment with each other. At the same time, the movable supporting member 27 and the extending arm 54 turn around the shaft 55, in a clockwise direction in FIG. 5, and the movable roller 24 moves to a point 24' shown in FIG. 5, away from the fixed roller 23.

Moreover, when the extending arm 54 moves to the point 54', the second arm 53 turns to a point 53' shown in FIG. 5. Consequently, the first arm 51 coupled to the turning shaft 52 turns in the clockwise direction in FIG. 6 to a point 51'. As a result, a direction in which the spring 59 urges the first arm is reversed, whereby the first arm 51 is retained in the point 51' shown in FIG. 6. At the same time, the second arm 53 and the extending arm 54 are also retained in the point 53' and the point 54', respectively, as shown in the diagram. In this manner, the movable roller 24 is retained, away from the fixed roller 23, so that the flexible substrate 1 can be introduced into a space between the movable roller 24 and the fixed roller 23.

After introducing the flexible substrate 1, when the operator presses the operating plate 54c of the extending arm 54 to return the extending arm 54 to its original position, the first arm 51 also turns to its original position. As a result, the urging direction of the spring 59 is reversed to the pressurization side, whereby the flexible substrate 1 is sandwiched between the movable roller 24 and the fixed roller 23.

Figure 7:
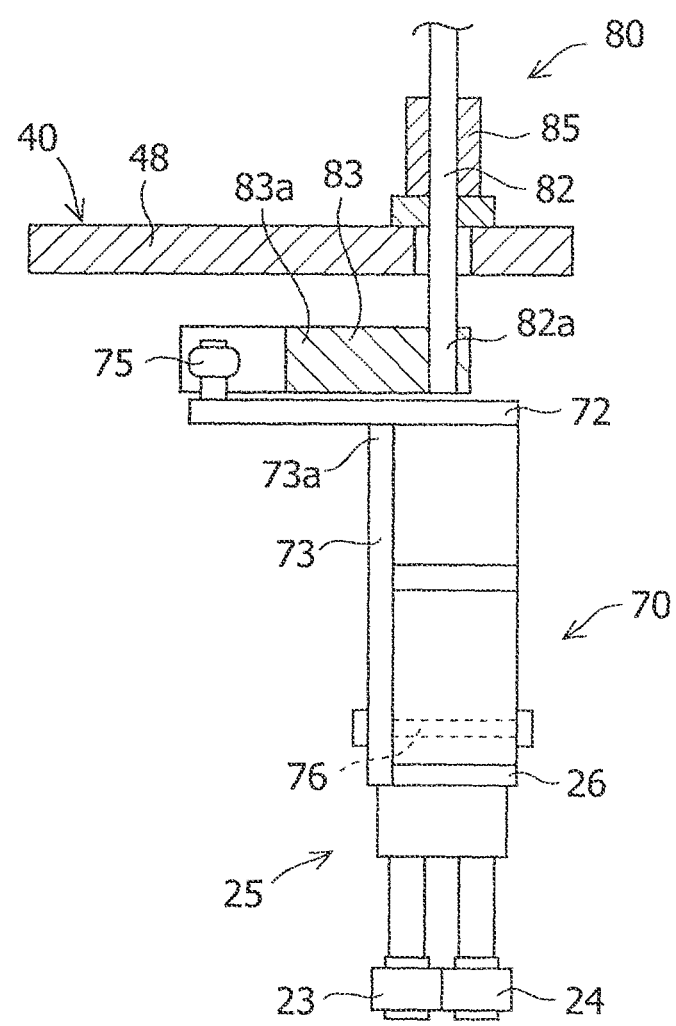
FIG. 7 is a cross-sectional diagram taken along a line B-B shown in FIG. 4.
Figure 8:
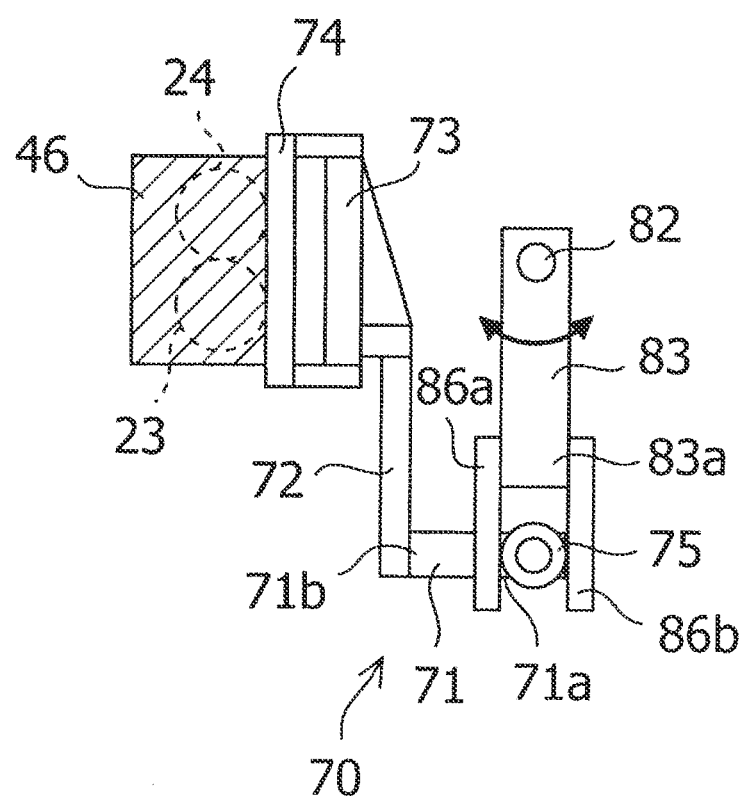
FIG. 8 is a cross-sectional diagram taken along a line C-C shown in FIG. 4.

Next, an angle adjusting mechanism 70 according to the present embodiment is described with reference to the drawings. FIG. 4 is an enlarged cross-sectional diagram of the substrate retaining device 21 of FIG. 3. FIG. 7 is a cross-sectional diagram taken along a line B-B shown in FIG. 4. FIG. 8 is a cross-sectional diagram taken along a line C-C shown in FIG. 4.

As shown in FIG. 4, the substrate retaining device 21 has an angle adjusting mechanism 70 that is configured to incline the pair of grip rollers 23, 24 with respect to the conveying direction of the flexible substrate 1, and an angle adjustment driving device (the second driving device) 80 that is configured to adjust an inclination angle of the pair of grip rollers 23, 24 with respect to the conveying direction of the flexible substrate 1.

As shown in FIGS. 7 and 8, the angle adjusting mechanism is configured from a first link 71 connected to the angle adjustment driving device 80, a second link 72 extending horizontally from the first link 71, a frame 73 extending downward from the second link 72 along the main structural material 46 of the film-forming chamber 40 and coupled to the bracket 26 of the support mechanism 25, and a base plate 74 disposed on the main structural material 46 of the film-forming chamber 40.

As shown in FIGS. 7 and 8, a roller 75 having a vertical axial core is attached turnably to one end 71a of the first link 71. The second link 72 is fixed to the other end 71b of the first link 71. The second link 72 extends horizontally from the first link and is coupled to an upper end part 73a of the frame 73.

As shown in FIGS. 4 and 7, the frame 73 is attached rotatably to the base plate 74 via a spindle 76 in the vicinity of the bracket 26 of the support mechanism 25. The frame 73 has a spring supporting part 73b above the spindle 76. One end of a support spring 77 is attached to the spring supporting part 73b. This support spring 77 is a compression spring and has the other end thereof attached to the base plate 74.

As shown in FIG. 4, the angle adjustment driving device 80 is configured from an actuator 81, a driving shaft 82 extending from the actuator 81, and a driving arm 83 fixed to the driving shaft 82.

The actuator 81 is a rotary actuator, such as a servomotor. The actuator 81 is disposed on an upper plate 84 that is fixed by a supporting frame.

As shown in FIG. 4, the driving shaft 82 of the actuator 81 is pierced through the ceiling panel 48 of the film-forming chamber 40, extends in the vertical direction, and is then attached to the ceiling panel 48 of the film-forming chamber 40 via a sealed bearing 85. The sealed bearing 85 is attached to an opening part 480b of the film-forming chamber 40 via a plate or an O-ring, to support the driving shaft 82 hermetically and turnably.

As shown in FIG. 7, the driving arm 83 is attached to a tip end part 82a of the driving shaft 82 and extends horizontally from the driving shaft 82 of the actuator 81 toward the first link 71. As shown in FIG. 8, a tip end part 83a of the driving arm 83 is provided with a pair of roller sandwiching parts 86a, 86b. The pair of roller sandwiching parts 86a, 86b is disposed in a manner as to face each other with a space, larger than a diameter of the roller 75 of the first link 71, therebetween.

Next is described, with reference to FIGS. 9 to 12, a procedure for adjusting an angle of the pair of grip rollers 23, 24 by using the actuator 81 of the angle adjustment driving device 80.

The actuator 81 of the angle adjustment driving device 80 is driven by a control signal that is output based on the detection value of the detection sensor (see FIG. 3) 49. The actuator 81 turns and displaces the driving arm 83 to a predetermined angular position by rotating the driving shaft 82.

Figure 9:
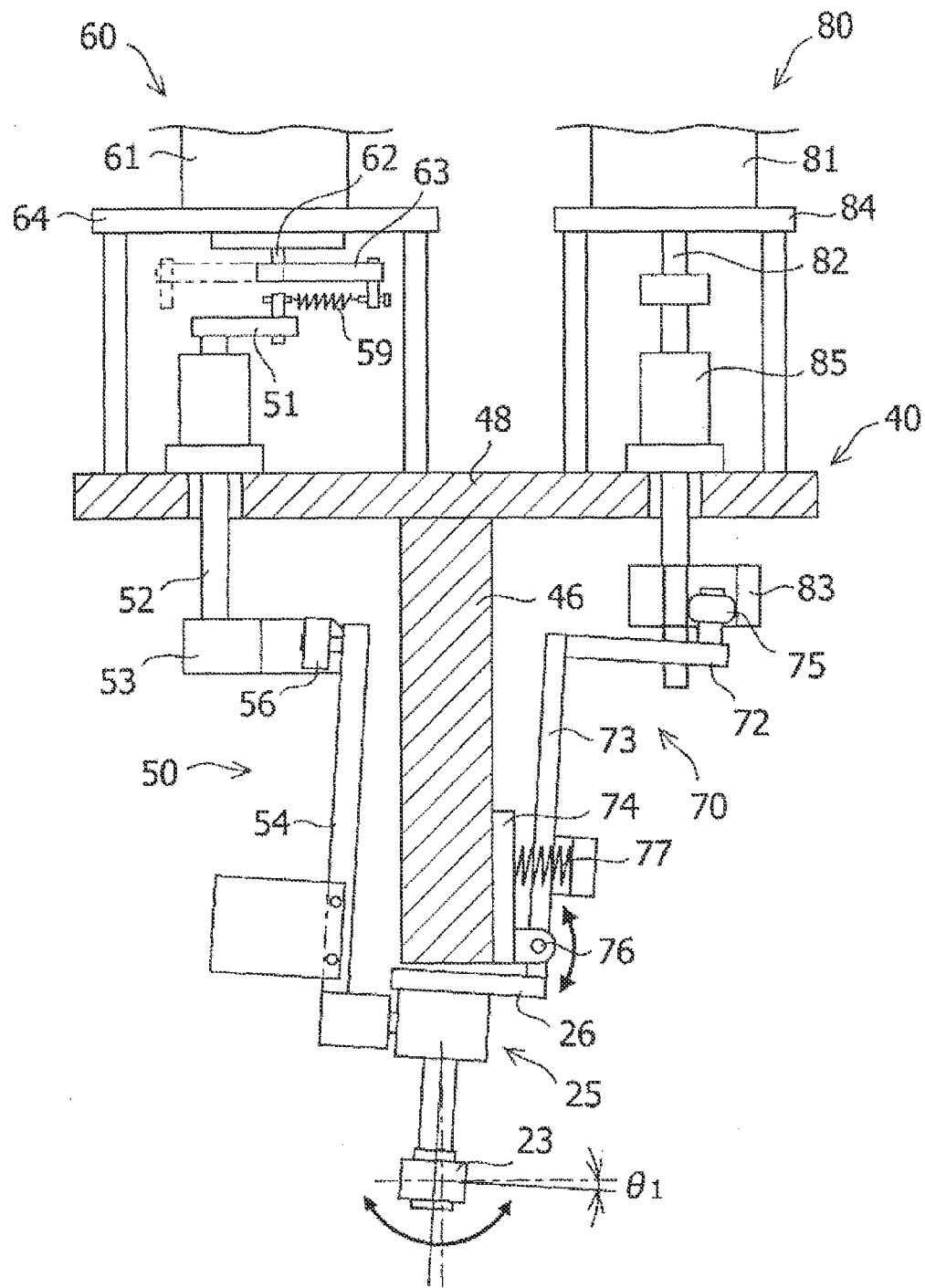
FIG. 9 is an enlarged cross-sectional diagram of the substrate retaining device of the conveying device according to the embodiment of the present invention, illustrating an example of how an angle of a pair of grip rollers is adjusted.
Figure 10:
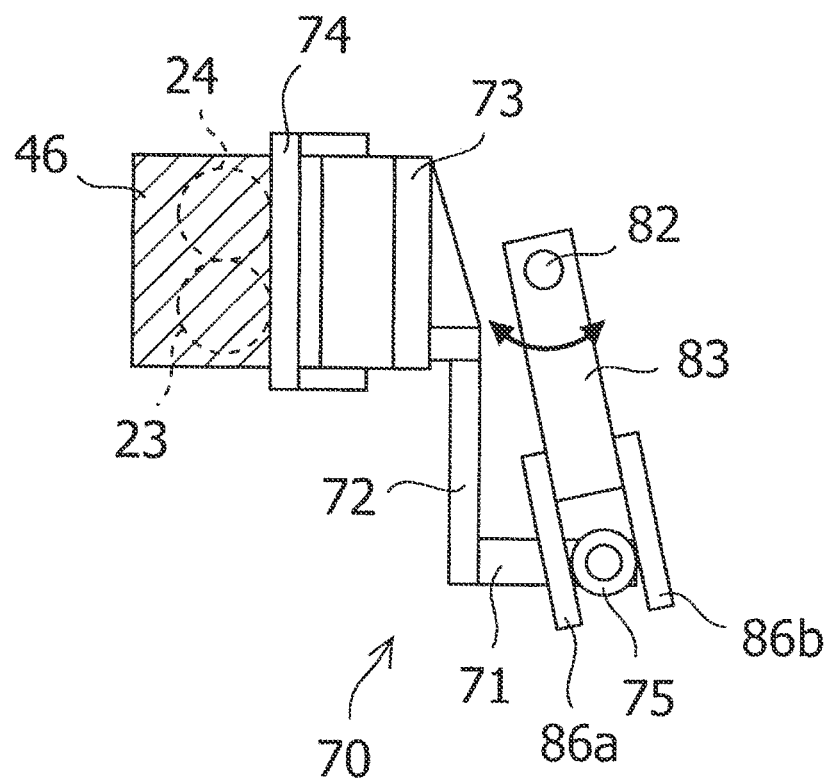
FIG. 10 is a cross-sectional diagram taken along a line A-A shown in FIG. 9.

FIGS. 9 and 10 are diagrams showing examples of how the angle of the pair of grip rollers 23, 24 is adjusted.

shown in FIG. 10, when the driving arm 83 is turned counterclockwise from a reference position shown in FIG. 8, the first and second links 71, 72 are moved in the conveying direction of the flexible substrate 1 in response to the angular displacement of the driving arm 83. Consequently, the frame 73 turns counterclockwise around the spindle 76 used as its supporting point, as shown in FIG. 9, and the bracket 26 of the support mechanism 25 is inclined downward with respect to the conveying direction of the flexible substrate 1. As a result, the pair of grip rollers 23, 24 also is inclined downward by an angle $\theta_1$ with respect to the conveying direction of the flexible substrate 1.

Figure 11:
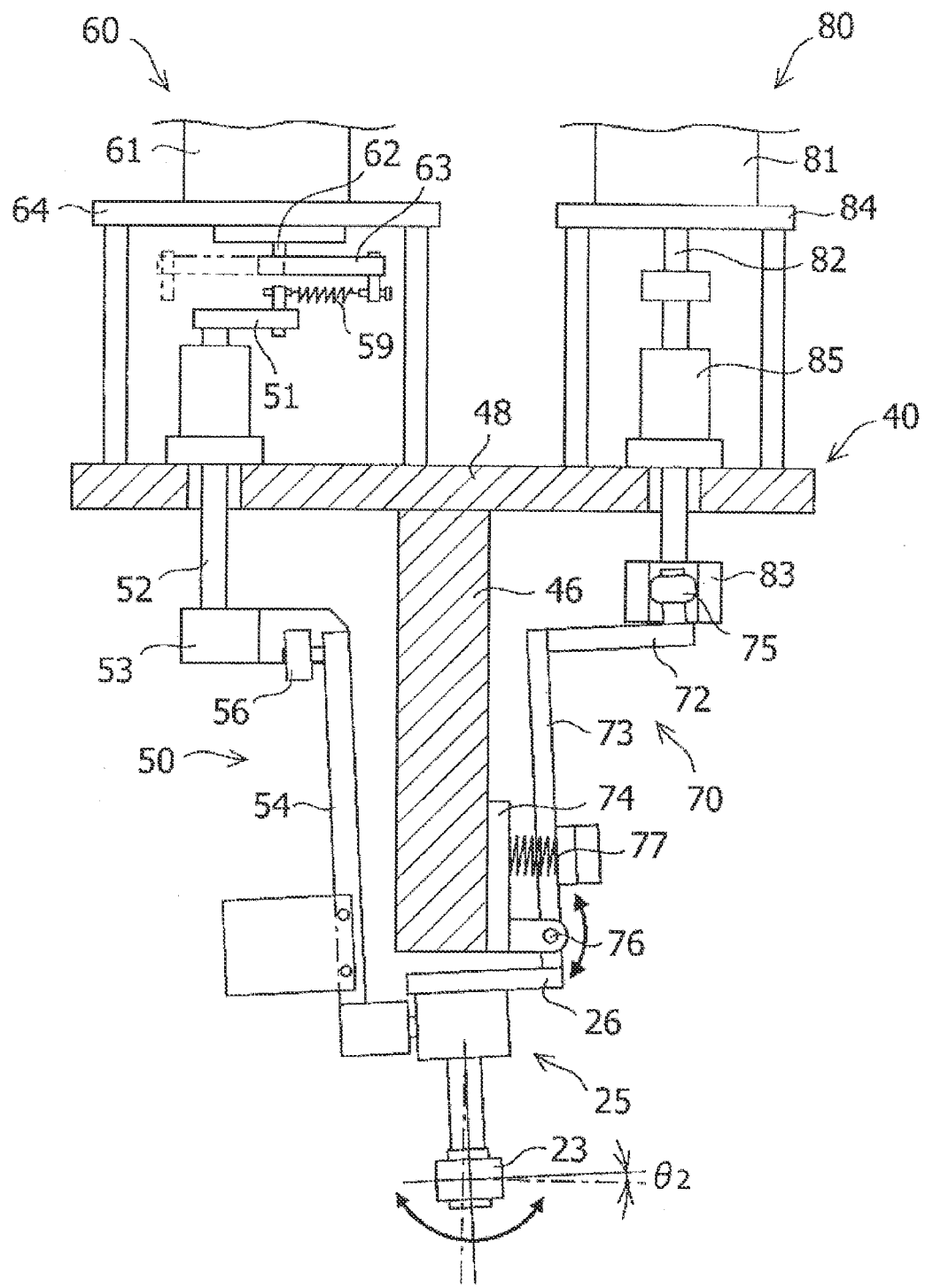
FIG. 11 is an enlarged cross-sectional diagram of the substrate retaining device of the conveying device according to the embodiment of the present invention, illustrating another example of how the angle of the pair of grip rollers is adjusted.
Figure 12:
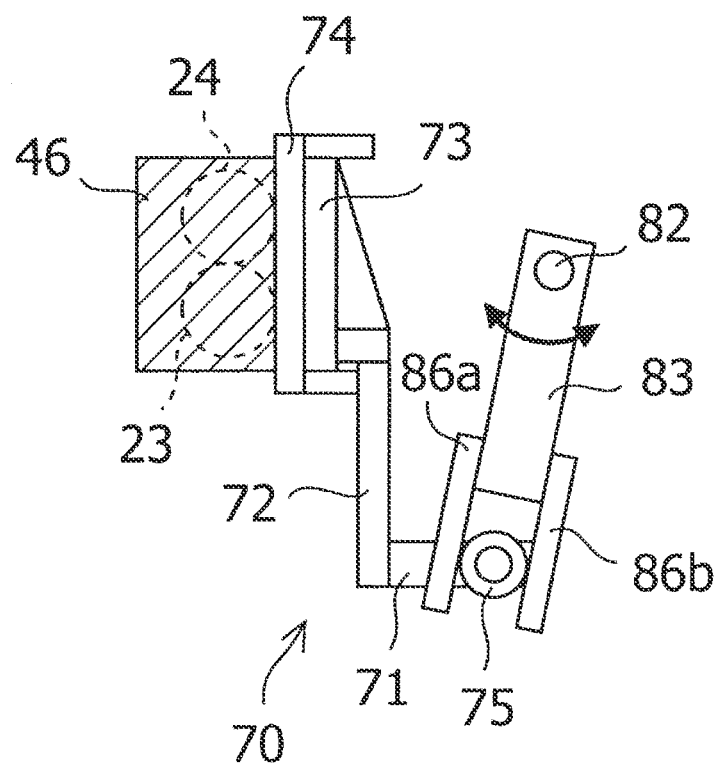
FIG. 12 is a cross-sectional diagram taken along a line A-A shown in FIG. 11.

FIGS. 11 and 12 are diagrams showing other examples of how the angle of the pair of grip rollers 23, 24 is adjusted.

As shown in FIG. 12, when the driving arm 83 is turned clockwise from the reference position shown in FIG. 8, the first and second links 71, 72 are moved in a direction opposite to the conveying direction of the flexible substrate 1, in response to the angular displacement of the driving arm 83. Consequently, the frame 73 turns clockwise around the spindle 76 used as its supporting point, as shown in FIG. 11, and the bracket 26 of the support mechanism 25 is inclined upward with respect to the conveying direction of the flexible substrate 1. As a result, the pair of grip rollers 23, 24 also is inclined upward by an angle $\theta_2$ with respect to the conveying direction of the flexible substrate 1.

The above has described, with reference, to FIGS. 4 to 12, the substrate retaining device 21 disposed above the flexible substrate 1, but the substrate retaining device 22 disposed below the flexible substrate 1 also has the same but inverted configuration.

Figure 13:
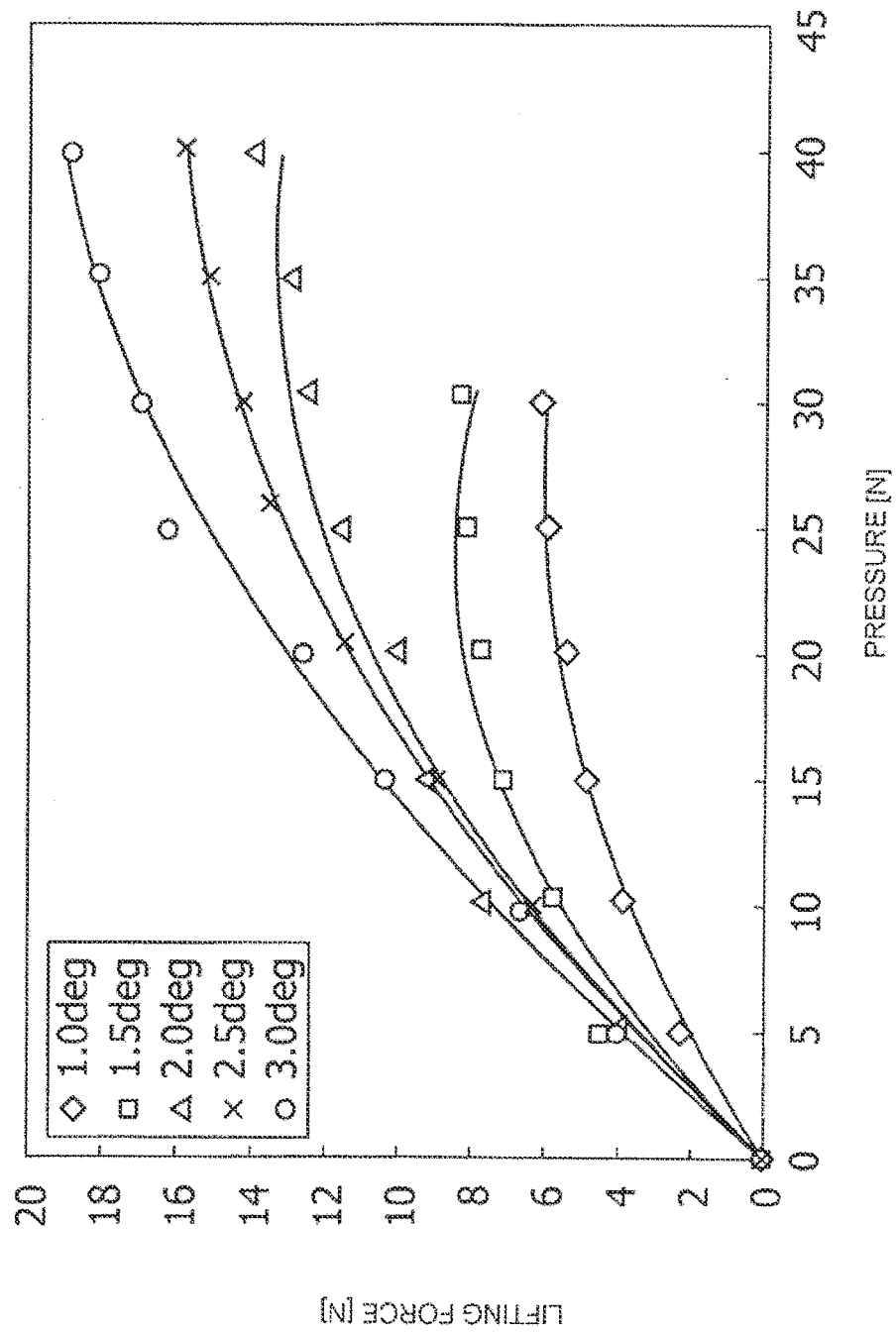
FIG. 13 is a diagram showing a relationship among a pressure (N) an generated in the pair of grip rollers, the angle (degrees) of the pair of grip rollers, and a lifting force (N) generated in a flexible substrate.
Figure 14A:
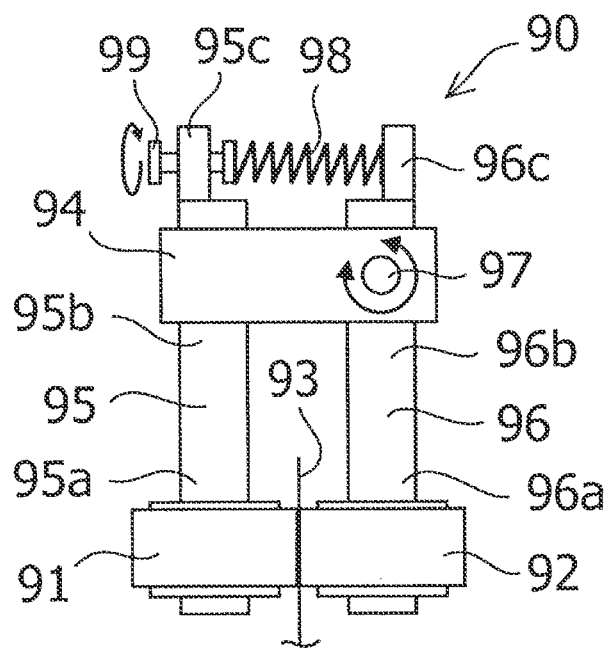
FIG. 14($a$) is a diagram showing a substrate retaining device of a conventional conveying device in a conveying direction of a flexible substrate, and FIG. 14($b$) is a cross-sectional diagram of the substrate retaining device of the conventional conveying device.
Figure 14B:
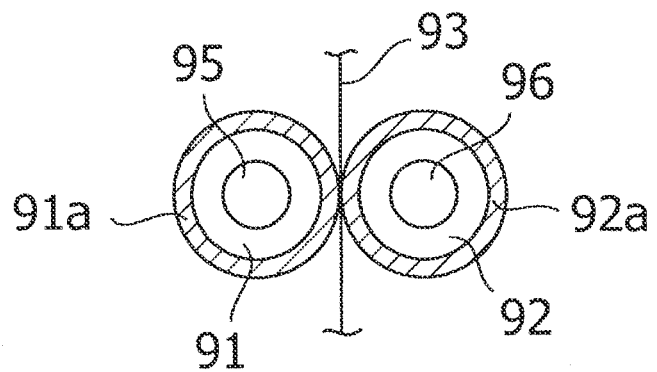

FIG. 13 shows a relationship among a pressure (N) generated in the pair of grip rollers 23, 24, the angle (deg) of the pair of grip rollers 23, 24, and a lifting force (N) generated in the flexible substrate 1. It should be noted that the angle of the pair of grip rollers 23, 24 shown in FIG. 13 is an angle obtained by inclining the grip rollers 23, 24 upward with respect to the conveying direction of the flexible substrate 1. In other words, FIG. 13 shows angles obtained by changing the angle $\theta_2$ shown in FIG. 11.

As shown in FIG. 13, when the pressure generated in the pair of grip rollers 23, 24 exceeds 25 N, an increase in the lifting force tends to converge (especially when the angle is 1.0° or 1.5°). In other words, increasing the pressure generated in the pair of grip rollers 23, 24 is not enough to obtain a certain or higher level of lifting force, due to an impact of a maximum frictional force between the pair of grip rollers 23, 24 and the flexible substrate 1.

However, the lifting force can be improved by increasing the angle of the pair of grip rollers 23, 24, as shown in FIG. 13. In other words, a larger lifting force can be obtained by controlling both the pressure generated in the pair of grip rollers 23, 24 and the angle of the pair of grip rollers 23, 24.

In the conveying device 100 according to the present embodiment, the angles $\theta_1$, $\theta_2$ of the pair of grip rollers 23, 24 can be wet within a range of 0.1° to 6°.

Moreover, although depending on the characteristics of the surfaces of the flexible substrate 1 and the grip rollers 23, 24, as well as contact pressure therebetween, when the angle of the pair of grip rollers 23, 24 exceeds 6° by inclining the grip rollers 23, 24 upward, a kinetic friction becomes proactive, and the lifting force does not tend to be improved.

Next, a procedure for maintaining the conveyance height of the flexible substrate 1 in the conveying device 100 is described with reference to the drawings.

As shown in FIG. 1, the flexible substrate 1 is conveyed from the unwinding part 10 to the winding part 30 via the film-forming part 20 at a predetermined cycle time. During a conveyance time period of the cycle time, the movable chamber 43 of the film-forming unit 41 is away from the fixed chamber 42. During the conveyance time period, the flexible substrate 1 is conveyed a distance corresponding to the length of a single film-forming chamber, between the movable chamber 43 and the fixed chamber 42.

Once the conveyance of the flexible substrate 1 is ended, the flexible substrate 1 enters the stop time period of the cycle time, in which the movable chamber 43 and the fixed chamber 42 of the film-forming unit 41 are closed. At this moment, the detection sensor 49 that is disposed on the downstream side of the conveying direction of the flexible substrate 1 detects a position of the vertical direction upper end part of the flexible substrate 1 (the conveyance height).

Here, when an upward or downward deviation occurs from a reference line, a detection value corresponding to a deviation direction or a degree of deviation is sent to the pressure adjustment driving device 60 and the angle adjustment driving device 80.

The pressure adjustment driving device 60 and the angle adjustment driving device 80 control the actuators 61, 81, respectively, based on this detection value. For example, as shown in FIG. 13, increasing the pressure generated in the pair of grip rollers 23, 24 is not enough to obtain a certain level of lifting force, the angle of the pair of grip rollers 23, 24 is adjusted by the angle adjustment driving device 80, while the pressure of the pair of grip rollers 23, 24 is increased by the pressure adjustment driving device 60. In this manner, the lifting force is increased.

Furthermore, when a desired lifting force is not obtained by increasing the pressure of the pair of grip rollers 23, 24 (when the frictional forces of the grip rollers 23, 24 drop), only the angle of the pair of grip rollers 23, 24 is adjusted by the angle adjustment driving device 80, to increase the lifting force.

Next, a film-forming step in the film-forming chamber 40 is ended, whereby the movable chamber 43 and the fixed chamber 42 of the film-forming unit 41 separate from each other. The flexible substrate 1 enters the conveyance period of the cycle time, in which the flexible substrate 1 is conveyed a distance corresponding to the length of a single film-forming chamber, between the movable chamber 43 and the fixed chamber 42. At this moment, because the flexible substrate 1 is conveyed by the lifting force increased by the pair of grip rollers 23, 24, the flexible substrate 1 moves upward, and the deviation of the flexible substrate 1 is corrected.

In this manner, detecting the conveyance height during the stop time period of the cycle time, adjusting the lifting force, and correcting the conveyance height in the conveyance time period, are executed alternately. As a result, the conveyance height of the flexible substrate 1 is maintained within a constant or predetermined intersection.

According to the conveying device. 100 of the present embodiment, the substrate retaining device 21 has: the pair of grip rollers 23, 24 that sandwiches at least the upper-side end part in the vertical direction of the flexible substrate 1 therebetween; the support mechanism 25 that rotatably supports the pair of grip rollers 23, 24 to contact with and separate from each other; the transmission mechanism 50 that transmits the force to pressure contact the grip roller 24 with the grip roller 23; the pressure adjustment driving device 60 that is configured to adjust the pressure contact force of the pair of grip rollers 23, 24 by performing an angular displacement on the coupled section where the pressure adjustment driving device 60 is coupled to the transmission mechanism 50; the angle adjusting mechanism 70 that is configured to incline the pair of grip rollers 23, 24 with respect to the conveying direction of the flexible substrate 1 by rotating around the spindle 76 used as the supporting point; and the angle adjustment driving device 80 that is configured to adjust the inclination angle of the pair of grip rollers 23, 24 with respect to the conveying direction of the flexible substrate 1 by performing the angular displacement on the coupled section where the angle adjustment driving device 80 is coupled to the angle adjusting mechanism 70. Therefore, even when the lifting force drops due to a decrease in the frictional forces of the grip rollers 23, 24 or a change in the diameter of the grip rollers 23, 24, the lifting force can be increased by allowing the angle adjusting mechanism 70 to adjust the angle of the pair of grip rollers 23, 24. As a result, the conveyance height of the flexible substrate 1 can be kept constant, preventing the flexible substrate 1 from being weighed down.

According to the conveying device 100 of the present embodiment, the flexible substrate 1 can be conveyed by adjusting not only the pressure between the pair of grip rollers 23, 24 but also the angle of the pair of grip rollers 23, 24. Therefore, the conveyance height of the flexible substrate 1 can be controlled with a high degree of accuracy.

According to the transmitting device 100 of the present embodiment, the transmission mechanism and the pressure adjustment driving device 60 are disposed in one of the adjacent film-forming chambers 40, the angle adjusting mechanism 70 and the angle adjustment driving device 80 are disposed in the other one of the adjacent film-forming chambers 40, and the pair of grip rollers 23, 24 and the support mechanism 25 are disposed in the boundary section between the adjacent film-forming chambers 40. Therefore, the substrate retaining device 21 can be installed in a small space between the adjacent film-forming chambers 40, conserving the installation space in the film-forming chambers 40.

Moreover, according to the conveying device 100 of the present embodiment, a support point of the spring 59 is angular-displaced around the coupling point with the transmission mechanism 50 in order to adjust the pressure of the pair of grip rollers 23, 24. Thus, even in a state in which an elastic displacement of the spring 59 is kept constant, a force contributing to the pressure of the pair of grip rollers 23, 24 (the orthogonal component of the tension of the spring 59) can be gradually increased/reduced in response to the angular displacement of the support point of the spring 59. This configuration is more advantageous than the conventional configuration where the support point or the spring is forward/backward-displaced in a direction in which the urging force thereof acts, in that only a small driving force is required to control the conveyance height, that the mechanism is simplified, and that the conveyance height can be controlled with a high degree of accuracy.

In addition, according to the conveying device 100 of the present embodiment, the pair of grip rollers 23, 24, the support mechanism 25, the transmission mechanism 50, and the angle adjusting mechanism 70 are disposed in the film-forming chamber 40, whereas the pressure adjustment driving device 60 and the angle adjustment driving device 30 are placed outside the film-forming chamber 40.

The inside the film-forming chamber 40 is depressurized to a predetermined degree of vacuum and keeps a relatively high temperature. Therefore, it is difficult in many ways to install therein actuator-containing driving device such as a motor or a fluid pressure cylinder. In the conveying device 100 of the present embodiment, therefore, the two driving 60, 80 installed outside the film-forming chamber 40 remotely operate the pressure and the angle of the pair of grip rollers 23, 24. Thus, the burdens on the driving devices 60, 80 and the like can be reduced, and the driving force can be transmitted efficiently into the film-forming chamber 40.

According to the conveying device 100 of the present embodiment, the substrate retaining devices 21, 22 are installed one above the other between the film-forming chambers 40 to retain both ends of the flexible substrate 1 in the width direction thereof (the vertical direction). Thus, the lifting force of the pair of grip rollers 23, 24 in the upper substrate retaining device 21 and the puling force of the pair of lower grip rollers of the lower substrate retaining device 22 can stretch the flexible substrate 1 in the width direction, preventing, more effectively, the generation of wrinkles in the flexible substrate 1.

The above has described the embodiment of the present invention. However, the present invention is not limited to this embodiment and can be modified and changed in various ways based on the technical idea of the present invention.

In the embodiment described above, the grip rollers are disposed on both the upper side and the lower side, but the grip rollers may be disposed only on the upper side. When the grip rollers are disposed only on the upper side, the flexible substrate 1 is conveyed upright, with one end part thereof being on upper side in the width direction.

Furthermore, when the grip rollers are disposed on both the upper side and the lower side, the flexible substrate 1 may be inclined vertically and conveyed, with one end part thereof being upper side in the width direction.

In the embodiment described above, the flexible substrate 1 is conveyed such that a longitudinal direction thereof corresponds to a horizontal direction. However, the longitudinal direction of the flexible substrate 1 may be inclined with respect to the horizontal direction.

In the embodiment described above, the lifting force is adjusted when executing the film-forming step in each film-forming chamber 40 during the stop time period of a predetermined cycle time while conveying the flexible substrate 1 at this cycle time. The present invention is not limited to this embodiment. Therefore, the lifting force can be adjusted when executing the film formation while continuously conveying the flexible substrates 1. In this case, the lifting force can be adjusted by allowing the detection sensor 49 to constantly monitor the conveyance height of the flexible substrate 1.

When there are less film-forming chambers 40 and the span for conveying the flexible substrate is relatively short, only the upper substrate retaining device 21 may be used for maintaining the conveyance height of the flexible substrate 1. In this case, the conveyance height of the flexible substrate 1 can be kept constant by balancing the gravity acting upon the flexible substrate 1 and the lifting force of the pair of grip rollers 23, 24 of the upper substrate retaining device 21.

EXPLANATION OF REFERENCE NUMERALS

1 Flexible substrate
10 Unwinding part
20 Film-forming part
30 Winding part
40 Film-forming chamber
41 Film-forming unit
50 Transmission mechanism
51 First arm
52 Turning shaft
53 Second arm
54 Extending arm
55 Axial part of extending arm
56 Roller of extending arm
57 Sealed bearing
58 Coupling pin of first arm
59 Spring
60 Pressure adjustment driving device
61 Actuator
62 Driving shaft
63 Driving arm
70 Angle adjusting mechanism
71 First link
72 Second link
73 Frame
74 Base plate
75 Roller of first link
76 Spindle
80 Angle adjustment driving device
81 Actuator
82 Driving shaft
83 Driving arm
100 Conveying device

What is claimed is:

1. A conveying device for conveying a belt-like flexible substrate, the conveying device comprising:
   a substrate conveying device for conveying the flexible substrate while holding the flexible substrate upright, with one end part in a width direction of the flexible substrate being on an upper side; and
   a substrate retaining device for maintaining a conveyance height of the flexible substrate,
   wherein the substrate retaining device has:
   a pair of grip rollers for sandwiching at least an upper-side end part of the flexible substrate;
   a support mechanism rotatably supporting the pair of grip rollers to contact with or separate from each other;
   a transmission mechanism coupled to the support mechanism and transmitting a force to pressure contact one of the grip rollers with the other grip roller;
   a first driving device coupled to the transmission mechanism and configured to adjust a pressure contact force of the pair of grip rollers by performing an angular displacement on a coupled section where the first driving device is coupled to the transmission mechanism;
   an angle adjusting mechanism coupled to the support mechanism and configured to incline the pair of grip rollers with respect to a conveying direction of the flexible substrate by rotating around a spindle used as a supporting point of the angle adjusting mechanism; and
   a second driving device coupled to the angle adjusting mechanism and configured to adjust an inclination angle of the pair of grip rollers with respect to the conveying direction of the flexible substrate by performing the angular displacement on a coupled section where the second driving device is coupled to the angle adjusting mechanism.

2. A conveying device according to claim 1, wherein the substrate retaining device further comprises:
   a pair of lower grip rollers for sandwiching a lower-side end part of the flexible substrate;
   a lower support mechanism rotatably supporting the pair of lower grip rollers to contact with and separate from each other;

a lower transmission mechanism coupled to the lower support mechanism and transmitting a force to pressure contact one of the lower grip rollers with the other lower grip roller;

a first lower driving device coupled to the lower transmission mechanism and configured to adjust a pressure contact force of the pair of lower grip rollers by performing an angular displacement on a coupled section where the first lower driving device is coupled to the lower transmission mechanism;

a lower angle adjusting mechanism coupled to the lower support mechanism and configured to incline the pair of lower grip rollers with respect to a conveying direction of the flexible substrate by rotating around a spindle used as a supporting point of the lower angle adjusting mechanism; and a second lower driving device coupled to the lower angle adjusting mechanism and configured to adjust an inclination angle of the pair of lower grip rollers with respect to the conveying direction of the flexible substrate by performing the angular displacement on a coupled section where the second lower driving device is coupled to the lower angle adjusting mechanism.

3. A conveying device according to claim 1, wherein a plurality of film-forming chambers for stacking a plurality of thin films on a surface of the flexible substrate to form a thin-film laminated body is disposed along the conveying direction of the flexible substrate, wherein at least one substrate retaining device is disposed between the plurality of film-forming chambers.

4. A conveying direction device according to claim 3, wherein the transmission mechanism and the first driving device are disposed in one of adjacent film-forming chambers, wherein the angle adjusting mechanism and the second driving device are disposed in the other adjacent film-forming chamber, and wherein the pair of grip rollers and the support mechanism are disposed in a boundary section between the adjacent film-forming chambers.

5. A conveying device according to claim 1, wherein the support mechanism comprises:

two roller supporting members to support the pair of grip rollers respectively;

an axial part for rotating one of the two roller supporting members such that one of the grip rollers of the two roller supporting members contacts with and separates from the flexible substrate; and a coupling part coupled to the transmission mechanism and supporting the axial part.

6. A conveying device according to claim 1, wherein the support mechanism comprises a roller supporting member rotating around a shaft as a center of rotation such that one of the grip rollers contacts with and separates from the flexible substrate, and the transmission mechanism comprises an arm coupled to the roller supporting member and rotating in synchronization with the roller supporting member; and a roller attached to a tip end of the arm to engage with the first driving device and supported rotatably by a shaft parallel to a rotation shaft of the arm.

7. A conveying device according to claim 1, wherein the transmission mechanism comprises:

a spring coupled to the first driving device and generating an urging force to pressure contact the grip rollers with each other;

a first arm rotating from the urging force of the spring;

a second arm rotating along with the first arm and transmitting a force corresponding to the rotation, as a torque to the support mechanism; and a shaft supporting part rotatably supporting a shaft that couples the first arm and the second arm to each other, and the first driving device comprises:

a driving arm coupled to the spring and rotating around an axis parallel to the shaft of the transmission mechanism as a center of rotation; and a driving device performing an angular displacement on a supporting point of the spring of the driving arm while maintaining a constant elastic displacement of the spring to adjust the pressure contact force of the pair of grip rollers.

8. A conveying device according to claim 1, wherein the angle adjusting mechanism comprises:

a spindle rotatably supporting the support mechanism to increase or reduce the inclination angle of the pair of grip rollers with respect to the conveying direction;

an urging device urging against a rotation direction of the support mechanism to increase or reduce the inclination angle of the pair of grip rollers with respect to the conveying direction;

a link transmitting a force to rotate the support mechanism around the spindle, and rotating in synchronization with the pair of grip rollers; and a roller pivotally supported on a tip end of the link to engage with the second driving device.

9. A conveying device according to claim 1, wherein the second driving device comprises:

a. driving arm having one end coupled to a turning shaft and the other end engaged with the angle adjusting mechanism;

a shaft supporting part rotatably supporting a turning axis of the driving arm; and a power device to rotate the driving arm around the turning axis to adjust the inclination angle of the pair of grip rollers with respect to the conveying direction.

* * * * *

UNITED STATES PATENT AND TRADEMARK OFFICE
CERTIFICATE OF CORRECTION

PATENT NO.       : 8,528,725 B2                          Page 1 of 1
APPLICATION NO.  : 13/512231
DATED            : September 10, 2013
INVENTOR(S)      : Masanori Nishizawa et al.

It is certified that error appears in the above-identified patent and that said Letters Patent is hereby corrected as shown below:

In the Specification

Change column 7, line 42, "pipe 15a," to --pipe 45a,--.

Change column 9, line 18, "The coupling pin 53" to --The coupling pin 58--.

Change column 9, line 48, "sensor 6.8" to --sensor 68--.

Change column 10, line 53, "the first arm is" to --the first arm 51 is--.

Change column 11, line 17 to 18, "mechanism is configured" to --mechanism 70 is configured--.

Change column 14, line 61, "driving device 30 are" to --driving device 80 are--.

Signed and Sealed this
First Day of July, 2014

Michelle K. Lee
*Deputy Director of the United States Patent and Trademark Office*